United States Patent [19]

Takemoto et al.

[11] Patent Number: 4,814,287

[45] Date of Patent: Mar. 21, 1989

[54] METHOD OF MANUFACTURING A SEMICONDUCTOR INTEGRATED CIRCUIT DEVICE

[75] Inventors: Toyoki Takemoto, Yawata; Kenji Kawakita, Hirakata; Hiroyuki Sakai, Moriguchi, all of Japan

[73] Assignee: Matsushita Electric Industrial Co. Ltd., Osaka, Japan

[21] Appl. No.: 82,212

[22] Filed: Aug. 6, 1987

Related U.S. Application Data

[62] Division of Ser. No. 654,144, Sep. 25, 1984, abandoned.

[30] Foreign Application Priority Data

Sep. 28, 1983 [JP] Japan .................. 58-181027

[51] Int. Cl.⁴ ............ H01L 21/76; H01L 21/95
[52] U.S. Cl. ....................... 437/62; 437/31; 437/33; 437/34; 437/67; 437/78
[58] Field of Search ............... 437/62, 67, 78

[56] References Cited

U.S. PATENT DOCUMENTS

| | | | |
|---|---|---|---|
| 3,791,024 | 2/1974 | Boleky | 29/577 |
| 3,955,269 | 5/1976 | Magdo | 29/577 |
| 4,210,925 | 7/1980 | Morcom | 357/49 |
| 4,502,913 | 3/1985 | Lechaton et al. | 437/67 X |
| 4,507,158 | 3/1985 | Kamins et al. | 437/62 X |
| 4,510,518 | 4/1985 | Van Vonno | 357/49 |
| 4,551,743 | 11/1985 | Murakami | 357/50 |
| 4,561,932 | 12/1985 | Gris et al. | 437/67 X |
| 4,604,162 | 8/1986 | Sobczak | 437/62 X |
| 4,685,198 | 8/1987 | Kawakita et al. | 437/73 |

FOREIGN PATENT DOCUMENTS

56-12749 7/1981 Japan .
60-28387 7/1985 Japan .

OTHER PUBLICATIONS

Zimmer et al., "IEEE Trans. on Electron Devices", vol. ED-26, No. 4, Apr. 1982, pp. 390–396.

Primary Examiner—Brian E. Hearn
Assistant Examiner—Tom Thomas
Attorney, Agent, or Firm—Spencer & Frank

[57] ABSTRACT

A method of manufacturing a semiconductor integrated circuit device of the bipolar type of the MOS type or an integration of the two types having high integration and high performance, in which the circuit includes a first device region of which the side surface and entire region of the lower portion of the active region are made of silicon oxide and a second device region of which the side surface and a part of the lower portion of the active region are made of silicon oxide. According to the present invention, a transistor whose bottom portion is opened and a transistor whose bottom portion is not opened can be freely provided on a substrate, thereby dividing the transistors into a transistor to which a voltage can be supplied from the substrate and a transistor to which the voltage can not be supplied from the substrate, so that the wiring which has been conventionally needed can be reduced. In addition, in such transistors which are completely separated, the parasitic effect with the circumference is completely prevented so that excellent characteristics can be provided.

9 Claims, 5 Drawing Sheets

METHOD OF MANUFACTURING A SEMICONDUCTOR INTEGRATED CIRCUIT DEVICE

This is a division of application Ser. No. 654,144 filed Sept. 25, 1984 now abandoned.

BACKGROUND OF THE INVENTION

1. Field of the Invention

The present invention relates to a semiconductor integrated circuit device having high density and high operating speed.

2. Description of the Prior Art

In semiconductor integrated circuits, high integration density, high operating speed and low electric power consumption are being achieved. However, such devices have a problem regarding the area necessary for circuit wiring. Although it is impossible to eliminate wiring for signal propagation, the area required for wiring of the power supply always presents a problem. This is because the current flowing through the power supply line is generally large and is apt to be easily obstructed by an increase in wiring resistance due to crossovers and or the like.

In bipolar integrated circuits, there are many devices in which the collector regions are connected to a power supply, so that a significant advantage will be provided if the substrate can be used as a common power supply for these devices. However, in the actual device, a P-N junction is made between the substrate and collector region and it is impossible to fetch only the potential of selected collectors from the substrate.

On the other hand, in MOS integrated circuit devices, for example, in a memory circuit or the like, two kinds of values of $V_t$ (threshold voltages) such as zero threshold and the like are needed in one chip. As a method of providing two kinds of $V_t$ values, the impurity concentration in the channel region is changed by ion implantation or the like. However, if the $V_t$ value can be independently varied by a substrate bias applied from the outside, an optimum device can be realized and the wiring for the power supply can be also omitted.

On the other hand, in CMOS integrated circuits, although it is slightly difficult to realize high integration density, they have an excellent feature of low electric power consumption, so that they are being widely used. However, a large drawback of such a CMOS device is that a so called latch-up phenomenon occur with an increase in density, so that an excessive current flows and will finally result in breakdown of the device. As for this latch-up phenomenon, a thyristor which is parasitically defined is turned on due to some surge current from the outside, so that an excess current flows. Therefore, the current gain $h_{FE}$ of the parasitic transistor becomes larger as the distance between the devices becomes narrower and the latch-up can be easily caused. Thus, such a latch-up phenomenon will be a problem in the future. In particular, since latch-up ordinarily occurs due to external noise entering through the input and output, it can be prevented by paying attention to the input and output terminals, setting the distance to be large and setting the value of $h_{FE}$ to be small. However, in case of a small IC and a device having extremely large input and output terminals, such a method is unsuitable since the device area is merely enlarged in vain. Consequently, in CMOS circuits, it is demanded to prevent latch-up without increasing the area.

The second problem in a conventional CMOS circuit relates to the operating speed. Although the operating speed of an MOS transistor increases with a decrease in area, the MOS transistor is inherently a device which is driven by a voltage and the current changes such that its value is squared with respect to the voltage. Therefore, in a circuit having a small fan out, the operating speed is fairly high; however, in an ordinary LSI having a large fan out, there is a drawback such that the operating speed rapidly decreases. On this point, the V-I characteristic of the bipolar device changes like an exponential function, so that there is an advantage such that the operating speed does not decrease to the same extent even in an LSI having a large fan out.

In view of the above, it is preferred to integrally form CMOS and bipolar devices having their respective advantages. As a process which has already been disclosed, there is a publication of Zimmer et al, "IEEE Trans on Electron Devices", Vol. ED-26, No. 4, pages 390–396, April, 1982. The process relates to a method in the CMOS process whereby an npn transistor is formed using the N well region as a collector of a bipolar device. Although the method is simple, it has a drawback such that the collector resistance increases since no buried layer of the collector exists. Therefore, in the case of the device in which CMOS and bipolar devices are integrally formed, it is necessary that it has a buried layer of a low resistance. As mentioned above, the requirements needed as a process for integration of bipolar and CMOS devices are as follows:

1. to have a structure such that no latch-up occurs even when the device area is small; and
2. to set the collector resistance of the integrated bipolar transistor to be sufficiently low.

SUMMARY OF THE INVENTION

It is an object of the present invention to provide a semiconductor integrated circuit of the bipolar type or MOS type or an integration of these two types having a high integration and high performance, in which the circuit comprises a first device region of which the side surface and whole region of the lower portion of the active region are made of silicon oxide and a second device region of which the side surface and a part of the lower portion of the active region are made of silicon oxide.

DESCRIPTION OF THE PREFERRED EMBODIMENTS

Figure 1A:
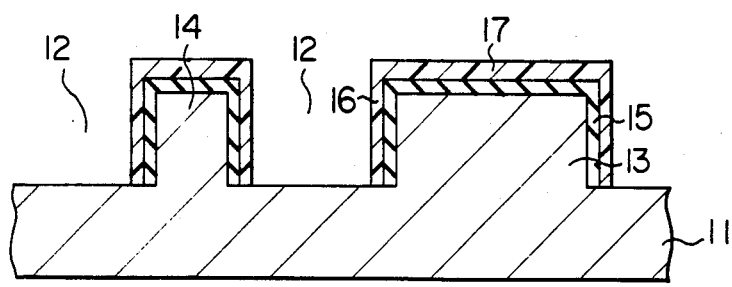
FIGS. 1a to 1e are process cross-sectional views showing a first embodiment of the present invention.

The practical invention will be explained by describing several embodiments.

FIG. 1 is a process cross-sectional view showing one embodiment of the present invention. In FIG. 1a, a reference numeral 11 denotes a silicon substrate; 12 is an opening portion formed by selectively removing the substrate 11; 13 and 14 are projecting portions formed by allowing the substrate to selectively remain, the width of the projecting portion 14 being narrower than that of projecting portion 13; 15 is a thermal oxidation film; and 16 an oxidation-resistant film, e.g., a silicon nitride film ($Si_3N_4$ film). Film 16 is formed in a manner such that only the silicon portion serving as the isolation region is selectively opened using a silicon nitride film mask 17 and after oxidization, the silicon nitride film is isotropically deposited; thereafter, the silicon nitride film is left on the side surface of the opening portion due to anisotropic etching of the silicon nitride film.

Figure 1B:
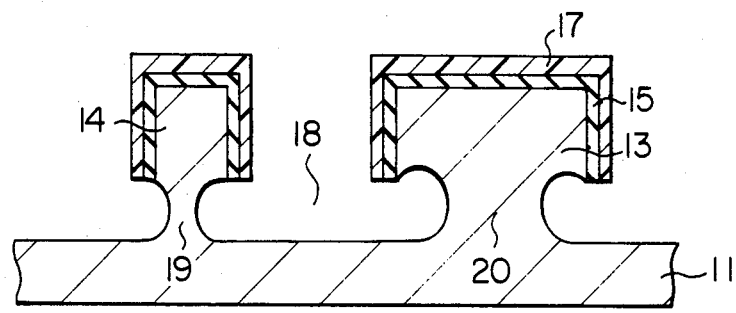

In FIG. 1b, by etching the substrate with a silicon etchant, the opening portion is further widened as indicated at 18. The bottom portions of the silicon projecting portions 13 and 14 are narrowed as indicated at 19 and 20 by the etching. Although isotropic chemical etching is generally desirable as the etching method, the desired object can be attained by performing chemical etching (wet etching) after the dry etching.

Figure 1C:
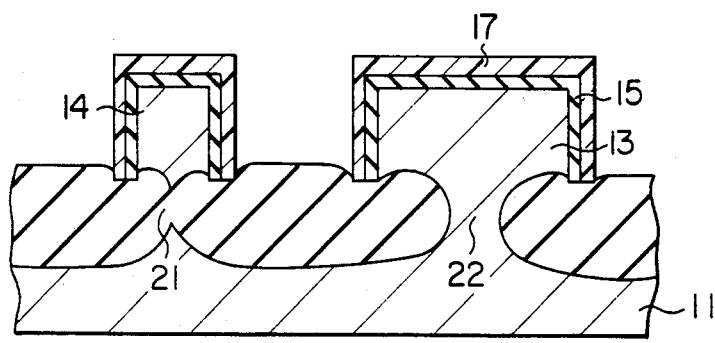
Figure 1D:
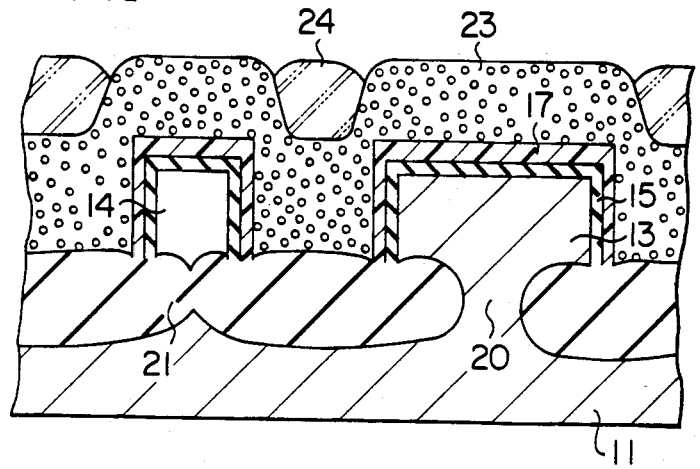

When the substrate is subjected to thermal oxidization in FIG. 1c, the portion 19 will have been changed to an oxide film as indicated at 21 due to the oxidization from both sides thereof as shown in FIG. 1c. On the other hand, since the portion 20 in FIG. 1b is relatively wide, it will remain although it is narrowed as indicated at 22.

Thereafter, polycrystalline silicon having a sufficient thickness is deposited (23 in FIG. 1d) and then is coated with a resist. Subsequently, by selectively removing the resist by a dry etching method, a resist 24 remains after the etching since the resist is thickly adhered on the concave portion. Then, by removing the polycrystalline silicon by the dry etching method enabling equal speed etching of polycrystalline silicon and resist, the planar structure as shown in FIG. 1e is obtained.

Figure 1E:
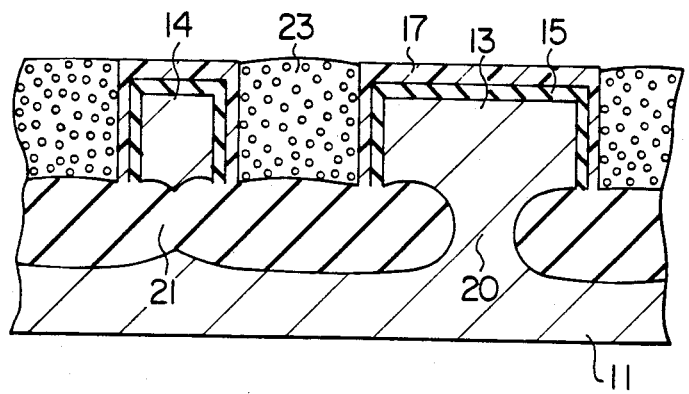

As can be seen from FIG. 1e, all of the monocrystalline portion 14 serving as the active region, including the bottom surface, is covered by insulating material (oxide film) 21. On the other hand, only the bottom portion of the monocrystalline portion 13 serving as the other active region is connected to the silicon substrate 11.

In addition, the remaining polycrystalline silicon may be oxidized and integrated with the oxide film 21.

Figure 2A:
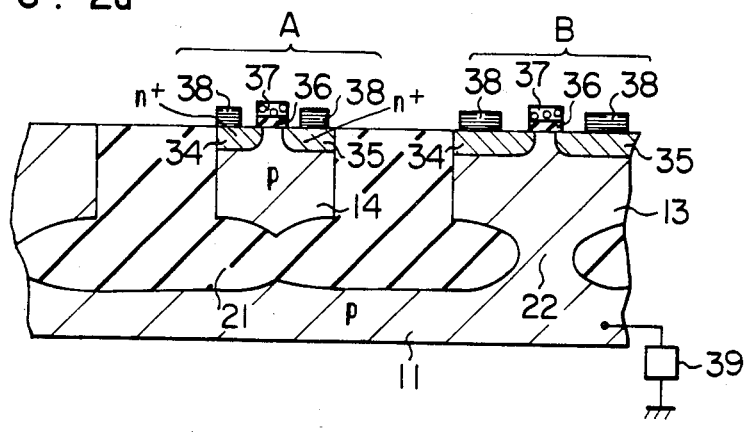
FIGS. 2a and 2b are, respectively a cross-sectional structural diagram of an MOS transistor and a circuit diagram of an E/D type inverter in the first embodiment of the invention.
Figure 2B:
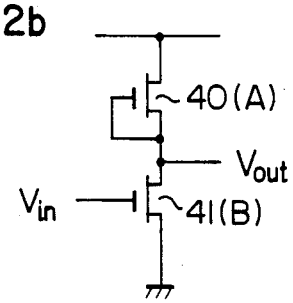

An example of an application of such a device will now be explained with reference to FIGs. 2a and 2b. FIGS. 2a and 2b show an example of an application to an MOS transistor, in which a numeral 11 denotes a p-type (100) silicon semiconductor substrate. The monocrystalline portion 14 is the substrate of the transistor completely separated by the oxide film 21. The monocrystalline portion 13 is connected to the substrate 11 through the portion 22. Numerals 34 and 35 indicate a drain and a source of the transistor, respectively; 36 is a gate oxide film; 37 a gate electrode portion, such as polycrystalline silicon; and 38 a metal electrode such as Al.

Ordinarily the values of $V_t$ (threshold voltage) of the respective MOS transistors A and B are not different; however, in the case where they are connected to a power supply indicated at 39 in the diagram and reverse biases are applied to the sources, the value of $V_t$ of the transistor B will be changed seemingly due to the effect of substrate bias. Namely, the case of the transistor A, the substrate potential below the channel region is not connected to the external power supply, while in the case of the transistor B, the substrate potential below the channel region can be changed by the externally applied voltage. Thus, as shown in FIG. 2b, for instance, if a circuit is constituted such that a transistor 40 is formed as a depletion type transistor and a transistor 41 having the structure of transistor B is formed as an enhancement type transistor by applying a bias voltage, an E/D type inverter can be formed by the same doping profile transistors. Further, the value of $V_t$ can be also changed due to the bias voltage. As will be obvious from this example, in such a transistor, by independently controlling the substrate biases with regard to the transistors 40 and 41, it is possible to constitute transistors having the independent threshold values, respectively. In addition, the selection of the structure of A or B for the transistors 40 and 41 may be performed in dependence upon the difference in their conductivity type or the like.

Figure 3A:
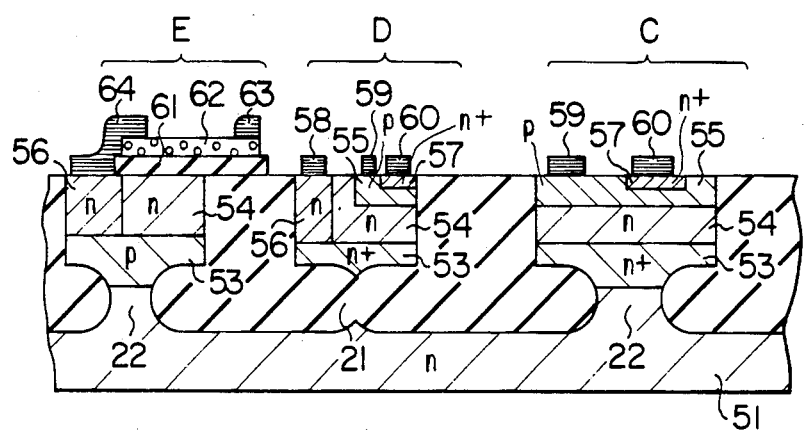
FIGS. 3a and 3b are a cross-sectional structural diagram of a bipolar transistor and a circuit diagram of a comparator in a second embodiment of the invention.
Figure 3B:
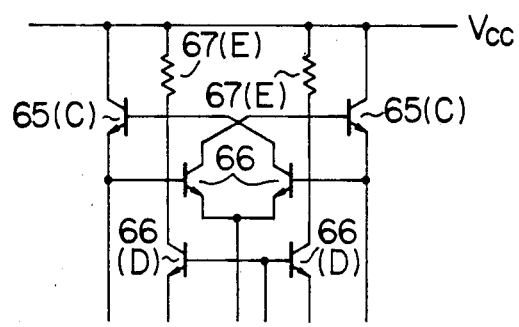

The second embodiment is shown in FIGS. 3a and 3b.

FIGS. 3a and 3b show an example of a bipolar transistor, in which the numeral 51 denotes an n-type (111) silicon semiconductor substrate having a specific resistance of about 0.05 $\Omega$cm; 53 is a buried region as a high concentration n+ layer containing As (arsenic) or the like; 54 an epitaxial n-type layer having a specific resistance of 0.6 to 1 $\Omega$cm; 55 a p-type base region having an impurity concentration of about $10^{18}/cm^3$; 56 a high impurity concentration n-type region as a collector wall region which is in electrical contact with the buried region 53; 57 an emitter of the high impurity concentration n-type region; 58, 59 and 60, respectively, collector, base and emitter electrodes of the transistor; 61 an oxide film on which a resistance element 62 consisting of polycrystalline silicon is formed; and 63 and 64 metals made of aluminum serving as electrodes, respectively, in which the electrode 63 is the output terminal and the electrode 64 is electrically connected to the substrate 51 through the collector wall 56 and the buried layer 53.

Respective features of the bipolar transistors formed in these region C, D and the resistor formed in the region E are as follows. In the case of the transistor in the region C, the collector region is connected to the substrate. The transistor in the region D has a structure similar to an ordinary transistor, namely, it is completely separated from the devices around it by the insulating oxide film 21. The device in the region E is the resistor and has the structure such that one end is connected to the substrate (power supply).

FIG. 3b shows an example of a circuit as a comparator for practically explaining the relationship with the device structure. In the diagram, a numeral 65 denotes transistors whose collector portions are connected to a power supply $V_{cc}$ and have the structure of the transistor in the region C of FIG. 3a; 66 shows transistors whose collectors are disconnected from the power supply section and have the structure of the transistor in the region D; resistors 67 may be resistor devices having the structure of the region E, whereby one end of each of the resistors 67 is connected to the power supply. It will be appreciated from this circuit diagram that the substrate 51 can be used as all of the power sources in the circuit of FIG. 3b and there is no need to arrange additional power sources over the device. On the other hand, substrate 51 has a side area and can be set to a low impedance, so that it is also suitable for use as the power supply.

Figure 4A:
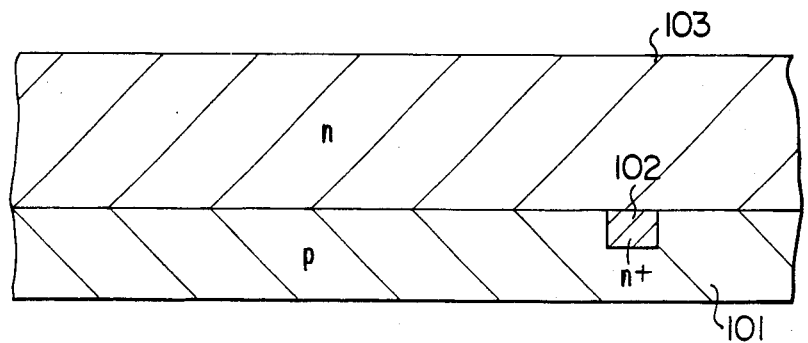
FIGS. 4a to 4c are process cross-sectional diagrams in a third embodiment of the invention.
Figure 4B:
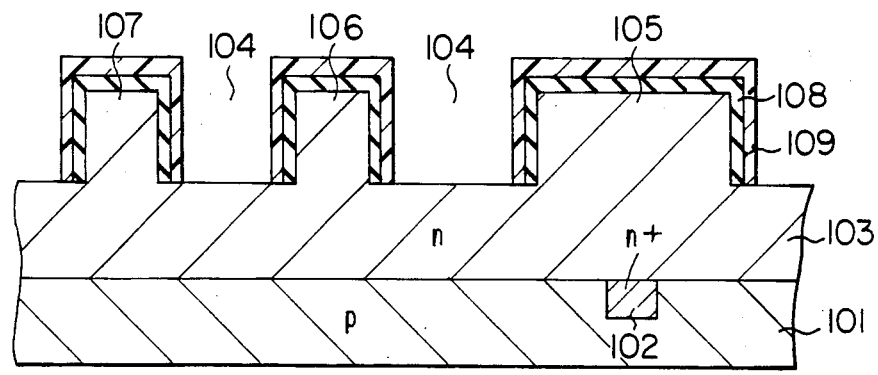
Figure 4C:
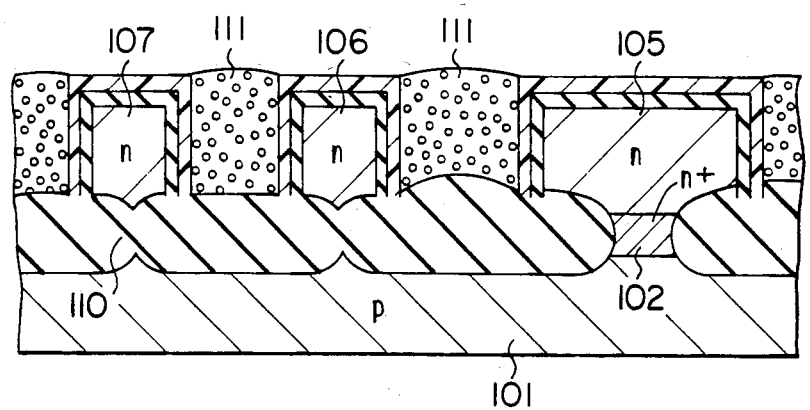

FIGS. 4a, 4b and 4c are process cross-sectional views showing the third embodiment. In FIG. 4a, a numeral 101 denotes a p-type (100) silicon substrate having a specific resistance of 10 to 20 $\Omega$cm; 102 is a layer of a high arsenic concentration buried in the substrate 101, which contains As (arsenic) with the surface concentration of $10^{20}/cm^3$; and 103 is an n-type monocrystalline silicon layer having a specific resistance of 0.6 to 2 $\Omega$cm and a thickness of 1 to 2 $\mu$m, wherein this layer is grown on the substrate 101. Next, in FIG. 4b, opening portions 104 and projecting portions 105, 106 and 107 are formed on the epitaxial layer 103 using a method similar to that in as the case of the foregoing embodiment shown in FIG. 1a. The widths of the projecting portions 106 and 107 are narrower than that of the projecting portion 105. The numeral 108 indicates a thermal oxidation film and 109 represents a silicon nitride film. Subsequently, by using a similar method to that shown in FIGS. 1a to 1e and after the bottom portions of the projecting portions 105, 106 and 107 were etched, they are subjected to thermal oxidation. Thus, as shown in FIG. 4c, the whole bottom surface and side regions of the projection portions 106 and 107 are covered by an oxide film 110. Only the bottom portion of the other projecting portion 105 is connected to the substrate 101 through the high impurity concentration buried layer 102. The numeral 111 denotes polycrystalline silicon deposited to obtain flatness.

Figure 5A:
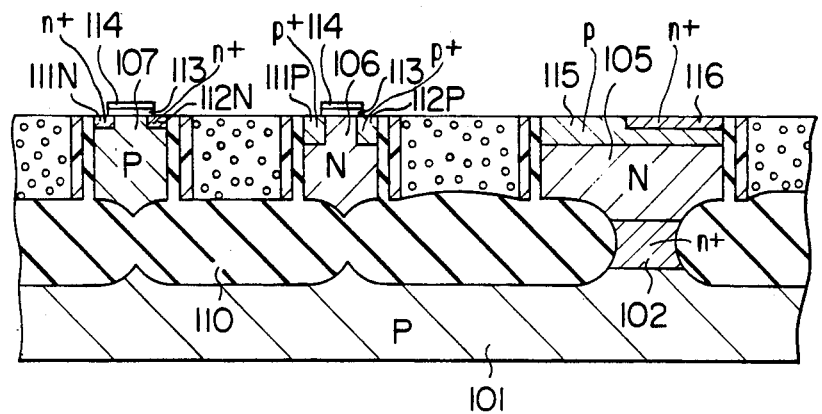
FIGS. 5a and 5b are, respectively a cross-sectional structural diagram of a device in which a CMOS and bipolar transistors are integrally formed in a plan view of the same in the third embodiment of the invention.

An example of an application of such a device will now be explained with reference to FIGS. 5a and 5b. FIG. 5a shows a cross-sectional view of the device structure in which CMOS and bipolar transistors are integrally formed, in which a numeral 101 denotes the p-type (100) silicon substrate and the projecting portions 106 and 107 become the active regions of the transistors completely separated by the oxide film 110. The n-channel and p-channel MOS transistors are respectively formed by the projecting portions 107 and 106. In addition, the projecting portion 105 becomes the active region having a structure such that it is connected to the substrate 101 through the high impurity concentration buried layer 102 and a bipolar transistor is formed by the projecting portion 105. Numerals 111N, 111P, and 112N, 112P are respectively sources and drains of the MOS transistors; 113 is a gate oxide film; 114 is a gate electrode such as of polycrystalline silicon; 115 is a base of the bipolar transistor; and 116 is an emitter thereof. On the other hand, the projecting portion 107 has been preliminarily converted to the p-type region by ion implantation of boron. In addition, the source and drain regions 111P and 112P of the p-channel MOS transistor and the base region 115 of a bipolar transistor are formed by simultaneously ion-implanting the p-type impurities. Also, the source and drain regions 111N and 112N of the n-channel MOS transistor and the emitter region 116 of the bipolar transistor are formed by simultaneously ion-implanting the n-type impurities.

Figure 5B:
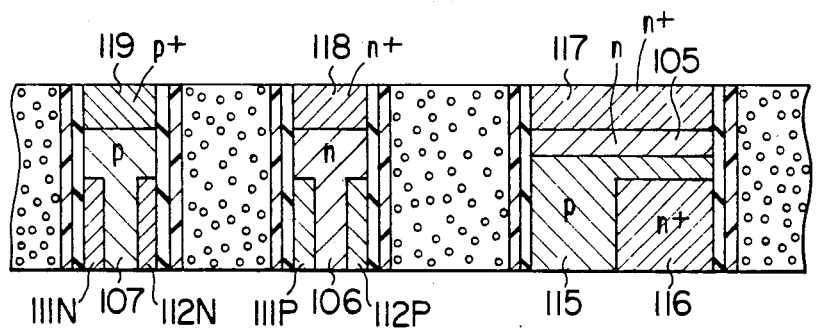

FIG. 5b shows a plan view of FIG. 5a. In this diagram, a numeral 117 denotes a collector wall which pierces through the collector region 105 and is connected to the buried impurity layer 102; 118 is an n+ diffusion layer for providing an ohmic contact with the n-type region; and 119 is a p+ diffusion layer for providing an ohmic contact with the p-type region.

As shown in the foregoing third embodiment, all of the bottom portions of the n-channel and p-channel MOS transistors are covered by the oxide films and no latch-up occurs in this structure. At the same time, the side surfaces of the source and drain regions are insulating films, so that parasitic capacitance is reduced and the operating speed is high in this structure. In addition, since the buried impurity layer of the bipolar transistor extends and reaches the substrate, the resistance is small and the collector resistance is also small.

According to the present invention, a transistor whose bottom portion is opened and the transistor whose bottom portion is not opened can be freely provided on a substrate, thereby dividing the transistors into a transistor to which a voltage can be supplied from the substrate and a transistor to which the voltage can not be supplied from a substrate, so that the wiring which has been conventionally needed can be reduced. In addition, in such transistors which are completely separated, the parasitic effect with the circumference is completely prevented, so that excellent characteristics can be provided.

We claim:

1. A method of manufacturing a semiconductor integrated circuit, comprising the steps of:
    a. isotropically etching away selected portions of a semiconductor substrate to form opening portions, and first and second projecting regions of different transverse widths projecting from the remaining portion of said substrate, the width of said first projecting regions being less than the width of said second projecting regions;
    b. forming an oxidation-resistant film portion on surfaces of said first and second projecting regions;
    c. partially etching away the lower portions of said first and second projecting regions including portions of the semiconductor substrate to expose portions of the semiconductor substrate;
    d. oxidizing the resulting exposed portions of the semiconductor substrate, while maintaining said oxidation-resistant film portion, to form an oxide region on the entire lower portions of said first projecting regions and to form an oxide region on only part of the lower portions of said second projecting regions;
    e. filling in the opening portions resulting from isotropically etching away in step a. by depositing an insulator therein; and
    f. forming semiconductor devices at the resulting first and second projecting regions.

2. The method according to claim 1, wherein the step of forming semiconductor devices comprises forming bipolar transistors at said first and second projecting regions.

3. The method according to claim 2, wherein the step of forming semiconductor devices comprises:
    forming a collector portion at each of the first projecting regions and at each of the second projecting region;
    connecting the collector portion of the bipolar transistor formed at each of the second projecting regions to said semiconductor substrate through a lower portion other than said oxide region of said second projecting region which is on only part of the lower portions thereof; and insulating from said substrate the collector portion of the bipolar transistor formed at each of the first projecting regions.

4. The method according to claim 3, wherein said semiconductor substrate and said first and second active regions are n type.

5. The method according to claim 1, wherein step d. comprises the further steps of:

covering the side surface and entire region of the lower portion of each of said first projecting regions by an insulating oxide; and covering the side surface and part of the region of the lower portion of each of said second projecting regions by an insulating oxide; and wherein step f. comprises the step of:

forming MOS transistors at said first and second projecting regions so as to apply a substrate potential to the MOS transistor formed at each said second projecting region from said semiconductor substrate.

6. The method according to claim 5, wherein said semiconductor substrate and said first and second projecting regions are of p type.

7. A method of manufacturing a semiconductor integrated circuit, comprising the steps of:

a. burying high impurity concentration layers at selected areas in the surface portion of a semiconductive substrate;

b. growing an epitaxial monocrystalline layer on the surface portion of said semiconductor substrate including the surface portion of said high impurity concentration layers;

c. isotropically etching away selected portions of said monocrystalline layer vertically to said semiconductor substrate in order to form opening portions, and first and second vertically projecting regions between the opening portions with said second vertically projecting regions being formed to project above said high impurity concentration layers, respectively;

d. forming an oxidation-resistant film portion on and along surfaces of said first and second vertically projecting regions;

e. partially etching away bottom portions of said first and second vertically projecting regions;

f. oxidizing remaining bottom portions of said first and second vertically projecting portions while maintaining said high impurity concentration layers in order to form an oxide region from the entire remaining bottom portions of said first vertically regions to thereby isolate same from said semiconductor substrate and to form an oxide region of the remaining bottom portions around said high impurity concentration layers of said second vertically projecting regions;

g. filling in the opening portions resulting from isotropically etching-away in step a. by depositing an insulator therein for planarization; and h. forming bipolar transistors at upper portions of said first and second vertically projecting regions wherein the transistor of said second vertically projecting region can be electrically connected through the high impurity concentration layer to said semiconductor substrate.

8. A method of manufacturing a semiconductor integrated circuit, comprising the steps of:

a. isotropically etching away selected portions of a semiconductor substrate to form opening portions, and at least two first and second projecting regions of different widths projecting from the remaining portions of said substrate, the width of said at least two first projecting regions being less than the width of said at least two second projecting regions;

b. forming an oxidation-resistant film portion on surfaces of said first and second projecting regions;

c. partially etching away lower portions of said at least two first and second projecting regions including portions of the semiconductor substrate to expose portions of the semiconductor substrate;

d. oxidizing the resulting exposed portions of the semiconductor substrate, while maintaining said oxidation resistant film portion, to form an oxide region on the entire lower portion of said at least two first projecting regions by covering the side surface and entire bottom surface regions of said lower portions of said at least two first projecting regions by an insulating oxide, and to form an oxide region on only part of the lower portions of said at least two second projecting regions by covering the side surface and partial bottom surface regions of said lower portions of said at least two second projecting regions by an insulating oxide;

e. filling in the opening portions resulting from isotropically etching away in step a. by depositing an insulator therein;

f. forming bipolar transistors respectively at one of said first and second projecting regions by forming a collector portion at the first projecting region and at the second projecting region, connecting the collector portion of the bipolar transistor formed at the second projecting region to said semiconductor substrate through a lower portion other than said partial lower oxide region of the second projecting region and insulating from said semiconductor substrate the collector portion of the bipolar transistor formed at said first projecting region; and g. forming MOS transistors respectively at the other of said first and second projecting regions so as to apply a substrate potential to the MOS transistor formed at said second projecting region from said semiconductor substrate through a lower portion other than said partial lower oxide region of the second projecting region.

9. A method of manufacturing a semiconductor integrated circuit, comprising the steps of:

a. isotropically etching away selected portions of a silicon substrate to form opening portions by using a first silicon nitride mask while forming first and second projecting regions of different transverse sizes projecting from the non-etched remaining portions of said substrate;

b. oxidizing and isotropically forming a second silicon nitride mask on surfaces of the resulting first and second projecting portions to form an oxidation-resistant film portion on the side surfaces of said first and second projecting portions;

c. partially etching away the bottom portions not covered by the oxidation-resistant film portion of said first and second projecting portions to leave narrowed bottom portions respectively of narrow and wide transverse widths of said projecting portions;

d. partially oxidizing the resulting semiconductor substrate, while maintaining said oxidation-resistant film portion, to form an oxide region on the entire narrow-width bottom portion of said first projecting portion and to form an oxide region on only part of the wide-transverse width bottom portion of said second projecting portion, the unoxidized central portion of the bottom of said second projecting portion being integral with the unoxidized bottom portion of said substrate;

e. forming a polycrystalline silicon layer on exposed upper surfaces of the oxidized semiconductor substrate and the oxidation-resistant film portion of said first and second projecting portions, said polycrystalline silicon layer defining projected upper surface portions and recessed upper surface portions according to the projecting portions and unprojected portions on said semiconductor substrate;

f. providing a photoresist layer on the projected and recessed upper surface portions of said polycrystalline silicon layer and etching away portions of the photoresist layer on said first and second projecting portions by using as a mask portions of the photoresist layer provided on said recessed upper surface portions;

g. further etching away portions of the polycrystalline silicon layer on said first and second projecting portions and etching away the photoresist layer mask portions to bring the upper surface of said first and second projecting portions and portions of the polycrystalline layer provided on said exposed upper surfaces of said oxidized semiconductor substrate to substantially the same level;

h. forming a MOS transistor at at least one of the resulting first projecting regions completely insulated by the entire bottom oxide portion from the unoxidized portion of said semiconductor substrate; and i. forming a bipolar transistor at at least one of the resulting second projecting regions integral with the unoxidized portion of said semiconductor substrate through the bottom central unoxidized portion.

* * * * *